(12) United States Patent
Shibuya et al.

(10) Patent No.: US 9,804,351 B2
(45) Date of Patent: Oct. 31, 2017

(54) OPTICAL RECEPTACLE AND OPTICAL MODULE

(71) Applicant: Enplas Corporation, Saitama (JP)

(72) Inventors: Kazutaka Shibuya, Saitama (JP); Shimpei Morioka, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 15/106,922

(22) PCT Filed: Dec. 22, 2014

(86) PCT No.: PCT/JP2014/083849
§ 371 (c)(1),
(2) Date: Jun. 21, 2016

(87) PCT Pub. No.: WO2015/098805
PCT Pub. Date: Jul. 2, 2015

(65) Prior Publication Data
US 2017/0038542 A1    Feb. 9, 2017

(30) Foreign Application Priority Data

Dec. 25, 2013  (JP) .................. 2013-267214

(51) Int. Cl.
| | |
|---|---|
| *G02B 6/26* | (2006.01) |
| *G02B 6/42* | (2006.01) |
| *H01L 31/0232* | (2014.01) |
| *G02B 6/32* | (2006.01) |
| *G02B 6/38* | (2006.01) |
| *H01S 5/022* | (2006.01) |
| *H01S 5/183* | (2006.01) |

(52) U.S. Cl.
CPC ........... *G02B 6/4255* (2013.01); *G02B 6/425* (2013.01); *G02B 6/4214* (2013.01);
(Continued)

(58) Field of Classification Search
None
See application file for complete search history.

(56) References Cited

U.S. PATENT DOCUMENTS

| | | | |
|---|---|---|---|
| 7,906,355 B2* | 3/2011 | Hodono | G02B 6/4204 |
| | | | 257/99 |
| 9,360,639 B2* | 6/2016 | Choraku | G02B 6/4249 |
| | | (Continued) | |

FOREIGN PATENT DOCUMENTS

| | | |
|---|---|---|
| JP | 2003-315630 A | 11/2003 |
| JP | 2004-191564 A | 7/2004 |
| | (Continued) | |

OTHER PUBLICATIONS

International Search Report from International Application No. PCT/JP2014/083849 dated Mar. 31, 2015.

*Primary Examiner* — Sung Pak
(74) *Attorney, Agent, or Firm* — Brundidge & Stanger, P.C.

(57) ABSTRACT

This optical receptacle has first optical surfaces via which light outputted by respective light-emitting elements is inputted, a second optical surface whereby light inputted via said first optical surfaces is outputted towards an end face of a light-transporting body, a third optical surface whereby light inputted via the first optical surfaces is reflected towards the second optical surface, a plurality of first concavities formed in the surface where the second optical surface is located, and a plurality of second concavities formed in the surface where the first optical surfaces are located or a surface opposite the surface where the first concavities are located. The first concavities and the second concavities are laid out opposite each other so that the central axes thereof coincide.

8 Claims, 8 Drawing Sheets

(52) U.S. Cl.
CPC ......... *G02B 6/4231* (2013.01); *G02B 6/4244* (2013.01); *G02B 6/4257* (2013.01); *H01L 31/0232* (2013.01); *H01S 5/02284* (2013.01); *G02B 6/32* (2013.01); *G02B 6/3885* (2013.01); *G02B 6/4292* (2013.01); *H01S 5/02248* (2013.01); *H01S 5/02292* (2013.01); *H01S 5/183* (2013.01)

(56) References Cited

U.S. PATENT DOCUMENTS

| | | | |
|---|---|---|---|
| 9,557,213 B2* | 1/2017 | Lin | G01J 1/0411 |
| 2004/0067015 A1* | 4/2004 | Nakajima | G02B 3/0018 |
| | | | 385/33 |
| 2004/0114866 A1* | 6/2004 | Hiramatsu | G02B 6/4292 |
| | | | 385/39 |
| 2005/0175297 A1* | 8/2005 | Mazotti | G02B 6/4201 |
| | | | 385/92 |
| 2006/0164738 A1 | 7/2006 | Yamamoto et al. | |
| 2013/0011100 A1* | 1/2013 | Shiraishi | G02B 6/3861 |
| | | | 385/77 |
| 2013/0266262 A1 | 10/2013 | Nishimura et al. | |
| 2014/0151585 A1* | 6/2014 | Hung | G01J 1/0411 |
| | | | 250/578.1 |
| 2014/0153881 A1* | 6/2014 | Liff | G02B 6/4214 |
| | | | 385/89 |

FOREIGN PATENT DOCUMENTS

| | | |
|---|---|---|
| JP | 2005-031556 A | 2/2005 |
| JP | 2007-25382 A | 2/2007 |
| JP | 2013-235243 A | 11/2013 |

* cited by examiner

OPTICAL RECEPTACLE AND OPTICAL MODULE

TECHNICAL FIELD

The present invention relates to an optical receptacle and an optical module including the optical receptacle.

BACKGROUND ART

In optical communications using optical transmission members such as optical fibers and light waveguides, optical modules have been used, provided with a light emitting element such as a surface-emitting laser (for example, VCSEL: Vertical Cavity Surface Emitting Laser). Such an optical module includes a transmitting optical receptacle that allows light including communication information emitted from a light emitting element to be incident on an optical transmission member, or a receiving optical receptacle that allows light from the optical transmission member to be incident on a light receiving element (see, e.g., PTL 1).

Figure 1:
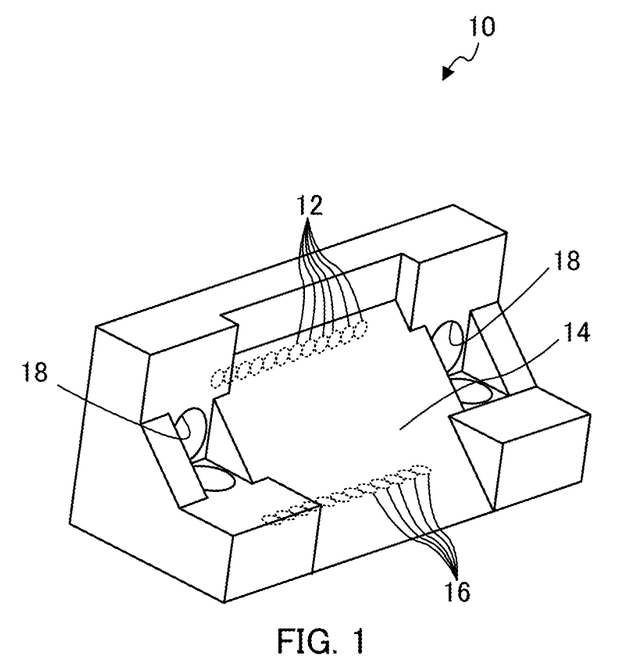
FIG. 1 is a perspective view of an optical receptacle according to PTL 1.

FIG. 1 is a perspective view of receiving optical receptacle 10 disclosed in PTL 1. As illustrated in FIG. 1, optical receptacle 10 includes a plurality of incidence surfaces 12 that allow light from a plurality of optical fibers to be respectively incident thereon, reflection surface 14 that reflects light incident on the plurality of incidence surfaces 12, a plurality of emission surfaces 16 that emit light reflected by reflection surface 14 respectively toward the plurality of light receiving elements, and a pair of guide holes 18 disposed such that reflection surface 14 is interposed therebetween. The plurality of optical fibers are housed in an optical connector, and convex parts of the optical connector are inserted into guide holes 18 to thereby connect the plurality of optical fibers to optical receptacle 10.

In optical receptacle 10 connected in such a manner, light emitted from the optical fiber is incident on incidence surface 12 to be reflected by reflection surface 14 toward the light receiving surface of the light receiving element, and then reaches the light receiving surface of the light receiving element through light emission surface 16.

Optical receptacle 10 disclosed in PTL 1 is integrally molded by injection molding using a thermoplastic transparent resin. Specifically, optical receptacle 10 is produced by pouring the thermoplastic transparent resin into a mold cavity for solidification, and then releasing optical receptacle 10.

CITATION LIST

Patent Literature

PTL 1: Japanese Patent Application Laid-Open No. 2005-031556

SUMMARY OF INVENTION

Technical Problem

However, when optical receptacle 10 disclosed in PTL 1 is produced by injection molding, mold portions corresponding to guide holes 18 are not easily extracted from guide holes 18, and thus optical receptacle 10 is undesirably deformed during releasing. Optical receptacle 10 having been deformed during releasing cannot return to the shape before releasing, and thus is unable to properly guide the light emitted from the optical fibers to the light receiving surface of the light receiving element in some cases. Thus, optical receptacle 10 disclosed in PTL 1 has a problem of being deformed when produced by injection molding.

An object of the present invention is to provide an optical receptacle which is not easily deformed even when produced by injection molding. Further, another object of the present invention is to provide an optical module having the optical receptacle.

Solution to Problem

An optical receptacle of the present invention is disposed between a plurality of light emitting elements or a plurality of light receiving elements and a plurality of optical transmission members, and is configured to optically couple the light emitting elements or the light receiving elements to end surfaces of the optical transmission members, respectively, the optical receptacle including: a plurality of first optical surfaces, each configured such that light emitted from a corresponding one of the light emitting elements is incident on the first optical surface or each configured to emit light propagating therein toward a corresponding one of the light receiving elements; a plurality of second optical surfaces, each configured to emit the light incident on the first optical surface toward an end surface of a corresponding one of the optical transmission members or each configured such that light from a corresponding one of the optical transmission members is incident on the second optical surface; a third optical surface configured to reflect the light incident on the first optical surface toward the second optical surface or configured to reflect the light incident on the second optical surface toward the first optical surface; a plurality of first recesses formed on a surface on which the plurality of second optical surfaces are disposed or a surface on which the plurality of first optical surfaces are disposed; and a plurality of second recesses formed on a surface opposite to a surface on which the first recesses are disposed, in which the plurality of first recesses and the plurality of second recesses are disposed opposite to each other such that central axes of the first recesses coincide, respectively, with central axes of the second recesses.

Further, an optical receptacle of the present invention is disposed between a plurality of light emitting elements or a plurality of light receiving elements and a plurality of optical transmission members, and is configured to optically couple the light emitting elements or the light receiving elements to end surfaces of the optical transmission members, respectively, the optical receptacle including: a plurality of first optical surfaces, each configured such that light emitted from a corresponding one of the light emitting elements is incident on the first optical surface or each configured to emit light propagating therein toward a corresponding one of the light receiving elements; a plurality of second optical surfaces, each configured to emit the light incident on the first optical surface toward an end surface of a corresponding one of the optical transmission members or each configured such that light from a corresponding one of the optical transmission members is incident on the second optical surface; a third optical surface configured to reflect the light incident on the first optical surface toward the second optical surface or configured to reflect the light incident on the second optical surface toward the first optical surface; and a plurality of recesses formed on a surface on which the plurality of second optical surfaces are disposed, in which each of the plurality of recesses includes a cylindrical recess body and a substantially truncated cone-shaped tapered part formed continuously to a bottom of the recess body.

An optical module of the present invention includes: a substrate on which a plurality of light emitting elements or a plurality of light receiving elements are disposed; and the optical receptacle of the present invention disposed on the substrate.

Advantageous Effects of Invention

According to the present invention, a plurality of light emitting elements or a plurality of light receiving elements can be optically coupled suitably to a plurality of optical transmission members even when an optical receptacle is produced by injection molding.

DESCRIPTION OF EMBODIMENTS

Hereinafter, embodiments of the present invention will be described in detail with reference to the accompanying drawings.

Embodiment 1

Configuration of Optical Module

Figure 2:
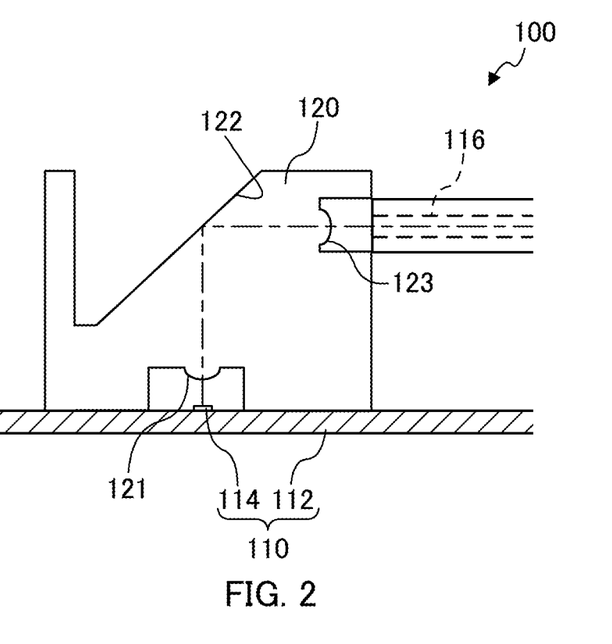
FIG. 2 is a cross-sectional view of an optical module according to Embodiment 1.
Figure 3A:
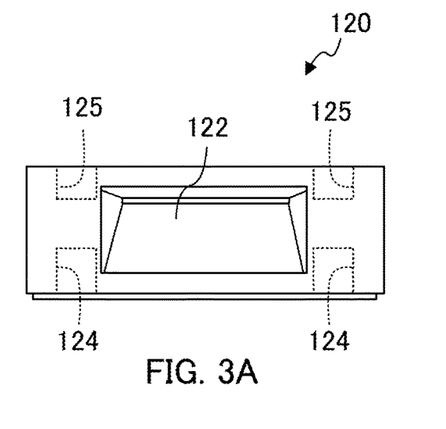
FIGS. 3A to 3E illustrate a configuration of an optical receptacle according to Embodiment 1.
Figure 3B:
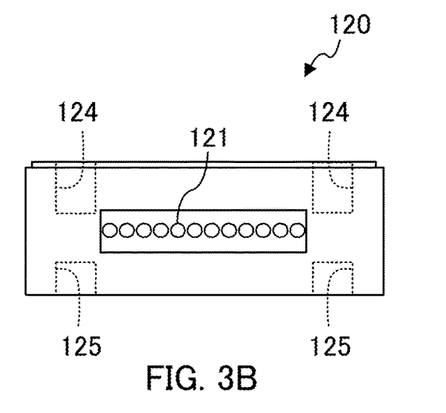
Figure 3C:
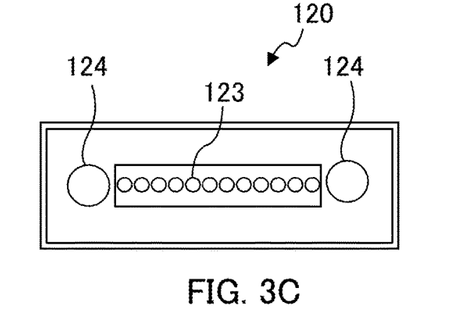
Figure 3D:
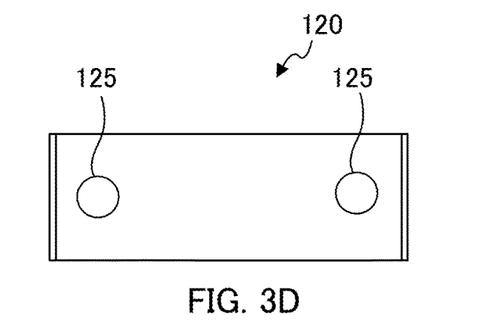
Figure 3E:
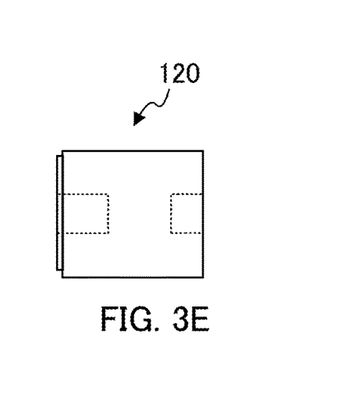
Figure 4A:
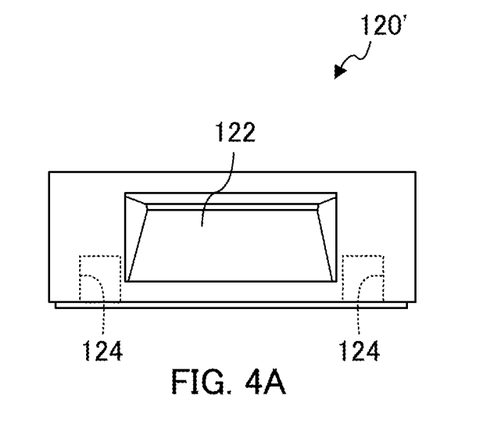
FIGS. 4A to 4E illustrate a configuration of an optical receptacle of a comparative example.
Figure 4B:
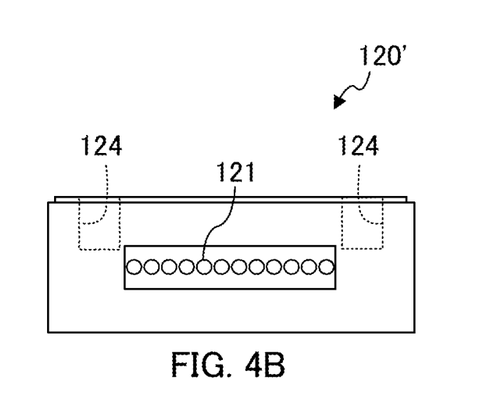
Figure 4C:
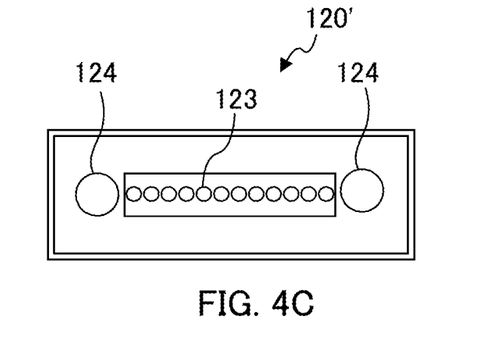
Figure 4D:
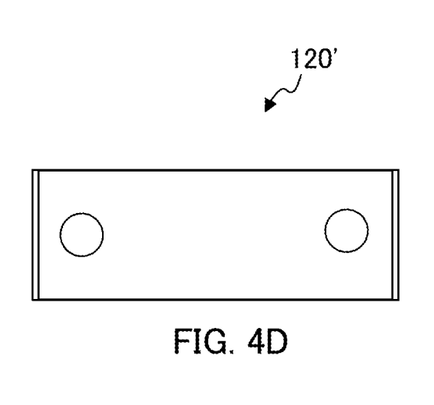
Figure 4E:
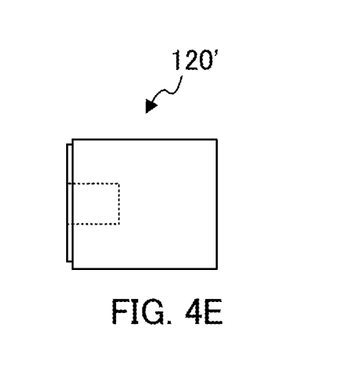

FIG. 2 is a cross-sectional view of optical module 100 according to Embodiment 1 of the present invention. In FIG. 2, hatching is omitted in the cross-section of optical receptacle 120 to show an optical path in optical receptacle 120.

As illustrated in FIG. 2, optical module 100 includes substrate-mounted photoelectric conversion device 110 including light emitting elements 114, and optical receptacle 120. Optical module 100 is used with optical receptacle 120 connected to optical transmission members 116. Optical transmission member 116 is not limited to any particular type and may be an optical fiber or a light waveguide, for example. In the present embodiment, optical transmission member 116 is an optical fiber. Further, the optical fiber may be a single-mode optical fiber or a multi-mode optical fiber.

Photoelectric conversion device 110 includes substrate 112 and a plurality of light emitting elements 114. Light emitting elements 114 are disposed in line on substrate 112, and configured to emit laser light in the direction perpendicular to the surface of substrate 112. Light emitting element 114 is, e.g., Vertical Cavity Surface Emitting Laser (VCSEL).

Optical receptacle 120 optically couples light emitting elements 114 to the end surfaces of optical transmission members 116, in the state of being disposed between photoelectric conversion device 110 and optical transmission members 116. A configuration of optical receptacle 120 is described in detail below.

(Configuration of Optical Receptacle)

FIGS. 3A to 3E illustrate a configuration of optical receptacle 120 according to Embodiment 1. FIGS. 3A to 3E are a plan view, a bottom view, a front view, a rear view and a right side view of optical receptacle 120, respectively.

As illustrated in FIGS. 3A to 3E, optical receptacle 120 is a substantially rectangular parallelepiped member. Optical receptacle 120 is light transmissive, and configured to emit light emitted from light emitting element 114 toward the end surface of optical transmission member 116. Optical receptacle 120 includes a plurality of first optical surfaces (incidence surfaces) 121, third optical surface (reflection surface) 122, a plurality of second optical surfaces (emission surfaces) 123, a plurality of first recesses 124, and a plurality of second recesses 125. Optical receptacle 120 is formed of a light-transmissive material with respect to light having a wavelength used for optical communications. Examples of the materials include transparent resins such as polyetherimide (PEI) and cyclic olefin resins. Optical receptacle 120 can be produced by injection molding, for example.

First optical surface 121 is an incidence surface that refracts laser light emitted from light emitting element 114 to allow the light to enter inside optical receptacle 120. A plurality of first optical surfaces 121 are disposed in line in the lengthwise direction on the bottom surface of optical receptacle 120 so as to face respective light emitting elements 114. The shape of first optical surface 121 is not particularly limited. In the present embodiment, the shape of first optical surface 121 is that of a convex lens surface protruding toward light emitting element 114. The shape of first optical surface 121 in plan view is a circle. The central axis of first optical surface 121 is preferably perpendicular to the light emitting surface of light emitting element 114 (and to the surface of substrate 112). Further, the central axis of first optical surface 121 preferably coincides with the optical axis of the laser light emitted from light emitting element 114. The light incident on first optical surface 121 (incidence surface) propagates toward third optical surface 122 (reflection surface).

Third optical surface 122 is a reflection surface that reflects the light incident on first optical surface 121 toward second optical surface 123. Third optical surface 122 is tilted such that the distance from optical transmission member 116 decreases in the direction from the bottom surface to the top surface of optical receptacle 120. The inclination angle of third optical surface 122 relative to the optical axis of light emitted from light emitting element 114 is not particularly limited. In the present embodiment, the inclination angle of third optical surface 122 is 45° relative to the optical axis of light incident on first optical surface 121. The shape of third optical surface 122 is not particularly limited. In the present embodiment, the shape of third optical surface 122 is a flat surface. The light incident on first optical surface 121 is incident on third optical surface 122 at an incident angle larger than the critical angle. Third optical surface 122 totally reflects the incident light toward second optical surface 123. That is, light with a predetermined light flux diameter is incident on third optical surface 122 (reflection surface), and the light with the predetermined light flux diameter is emitted toward second optical surface 123 (emission surface).

Second optical surface 123 is an emission surface that emits the light totally reflected by third optical surface 122 toward the end surface of optical transmission member 116. A plurality of second optical surfaces 123 are disposed in line in the lengthwise direction on a side surface of optical receptacle 120 so as to face respective end surfaces of optical transmission members 116. The shape of second optical surface 123 is not particularly limited. In the present embodiment, the shape of second optical surface 123 is that of a convex lens surface protruding toward the end surface of optical transmission member 116. This enables the light having the predetermined light flux diameter reflected by third optical surface 122 to be efficiently coupled to the end surface of optical transmission member 116. The central axis of second optical surface 123 preferably coincides with the central axis of the end surface of optical transmission member 116.

First recesses 124 are each a recess for fixing optical transmission members 116 to optical receptacle 120 (surface on which the plurality of second optical surfaces 123 are disposed). By fitting projections of an optical transmission member attachment respectively to first recesses 124, optical transmission members 116 are fixed to the surface of optical receptacle 120, on which the plurality of second optical surfaces 123 are disposed.

The shape and the number of first recesses 124 are not particularly limited as long as first recess 124 enables optical receptacle 120 to be fixed to substrate 112. That is, any shape of first recess 124 is possible as long as first recess 124 has a shape complementary to the projection of the optical transmission member attachment. In the present embodiment, the shape of first recess 124 is a cylindrical shape. In addition, any number of first recesses 124 is possible as long as first recess 124 enables optical transmission member 116 to be fixed to optical receptacle 120; typically a plurality of first recesses 124 are formed. In the present embodiment, two first recesses 124 are disposed on the surface on which the plurality of second optical surfaces 123 are disposed, such that all second optical surfaces 123 are interposed therebetween in the lengthwise direction. The plurality of first recesses 124 are formed at positions symmetrical with respect to a plane as a symmetry plane which is parallel to the optical axis of light passing through second optical surface 123 and halves third optical surface 122 in a vertical direction. Further, the diameter and the depth of the opening of first recess 124 are not particularly limited either as long as the opening of first recess 124 has a shape complementary to the projection of substrate 112.

Second recesses 125 are each a recess for suppressing the deformation of optical receptacle 120 caused by first recess 124 during releasing in the case of producing optical receptacle 120 by injection molding. Second recess 125 opens to a side surface opposite to the surface on which first recesses 124 are disposed. The shape of second recess 125 is not particularly limited as long as stress that occurs in releasing first recess 124 can be offset. In the present embodiment, the shape of second recess 125 is a cylindrical shape. Further, the diameter and the depth of the opening of second recess 125 are not particularly limited either; the diameter and the depth thereof may be set depending on the stress that occurs in releasing first recess 124.

The plurality of first recesses 124 and the plurality of second recesses 125 are disposed opposite to each other. The central axes of plurality of first recesses 124 and the central axes of the plurality of second recesses 125 respectively coincide with each other. When the central axes of first recesses 124 and second recesses 125 fail to coincide with each other, it is not possible to offset the stress that occurs in releasing first recesses 124.

(Measurement of Distortion of Third Optical Surface)

The shape of third optical surface 122 after releasing when producing optical receptacle 120 according to Embodiment 1 by injection molding was measured using an interferometer or a three-dimensional measuring instrument. In addition, for comparison, also with regard to optical receptacle 120' which does not include second recesses 125, the shape of third optical surface 122 after releasing was measured.

Figure 5A:
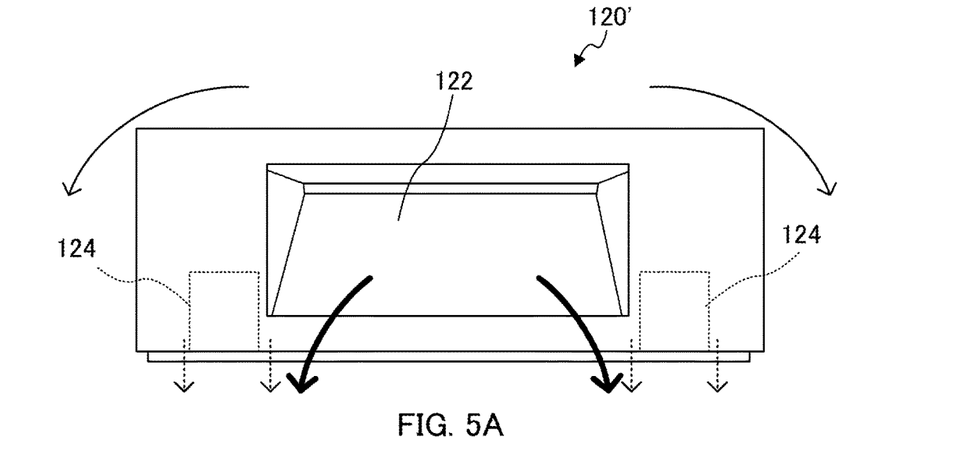
FIGS. 5A and 5B are explanatory diagrams of distortion of the optical receptacle of the comparative example.
Figure 5B:
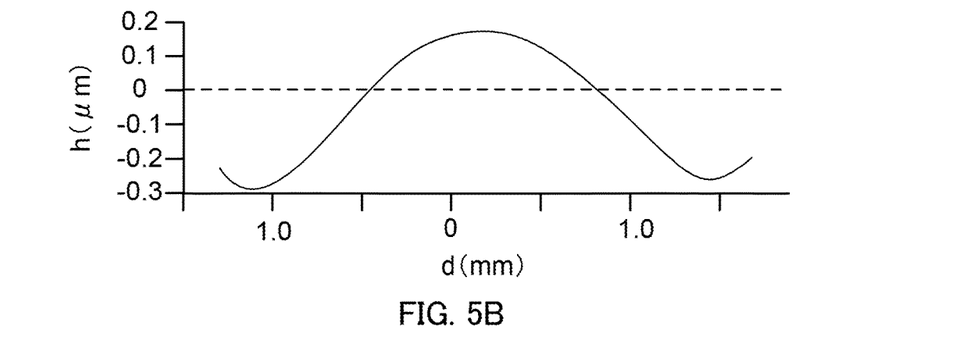
Figure 6A:
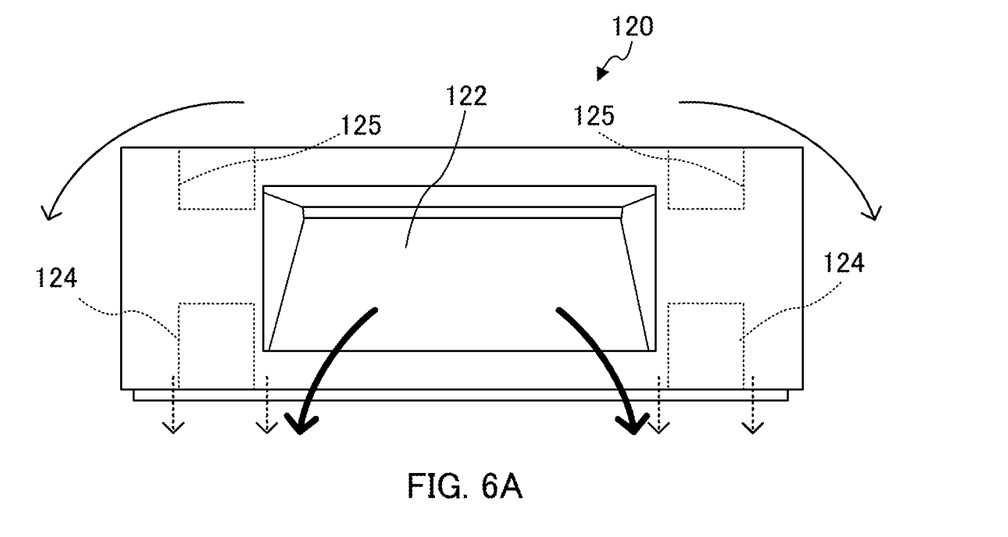
FIGS. 6A and 6B are explanatory diagrams of distortion of the optical receptacle according to Embodiment 1.
Figure 6B:
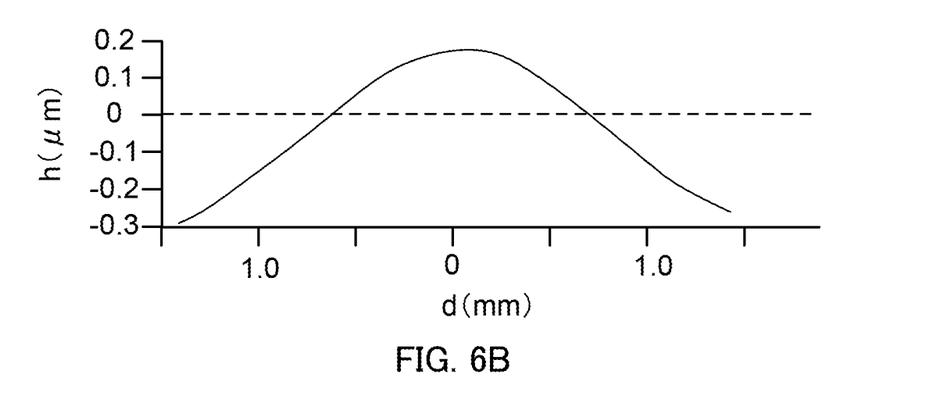
Figure 7A:
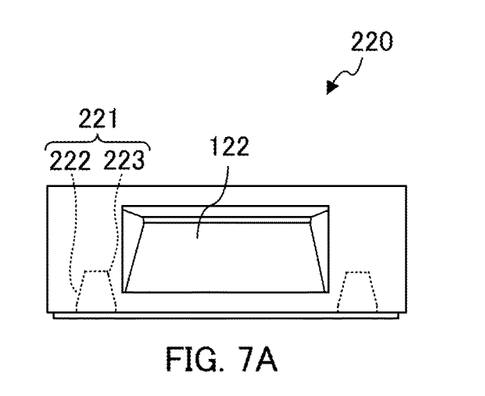
FIGS. 7A to 7E illustrate a configuration of an optical receptacle according to Embodiment 2.
Figure 7B:
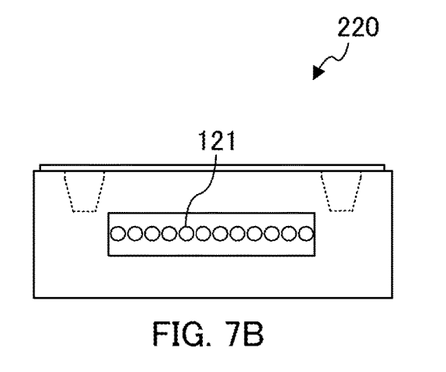
Figure 7C:
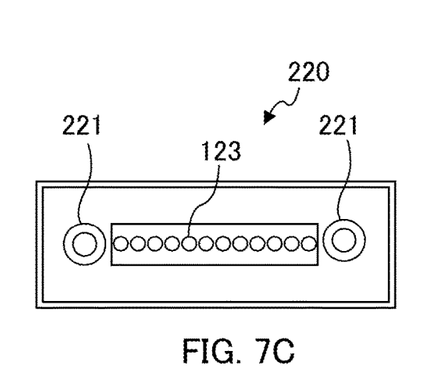
Figure 7D:
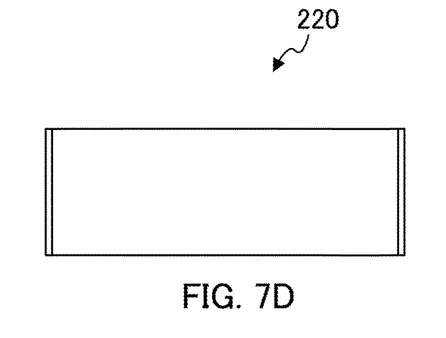
Figure 7E:
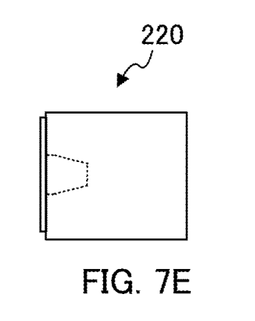

FIGS. 4A to 4E illustrate a configuration of optical receptacle 120' according to a comparative example. FIGS. 4A, 4B, 4C, 4D, and 4E are, respectively, a plan view, a bottom view, a front view, a rear view, and a right side view of optical receptacle 120' of the comparative example. FIGS. 5A, 5B, 6A, and 6B are explanatory diagrams of distortion of third optical surfaces 122 of optical receptacles 120 and 120' produced by injection molding. FIG. 5A illustrates force applied to optical receptacle 120' of the comparative example at the time of injection molding, and FIG. 5B is a graph showing the shape of third optical surface 122 of the comparative example after injection molding. FIG. 6A illustrates force applied to optical receptacle 120 according to Embodiment 1 at the time of injection molding, and FIG. 6B is a graph showing the shape of third optical surface 122 according to Embodiment 1 after injection molding. In FIGS. 5B and 6B, the abscissa indicates distance d from the center of third optical surface 122. The ordinate indicates deformation amount h of third optical surface 122 in the normal direction.

First, the case of producing conventional optical receptacle 120' by injection molding will be described. As illustrated in FIG. 5A, conventional optical receptacle 120' has recesses formed on a side surface, and thus requires at least a mold that molds a side surface on which recesses are formed in the injection molding. In the case where such a mold is used to perform injection molding followed by releasing, optical receptacle 120' is pulled toward the mold side (downward in FIG. 5) at the positions of the recesses by friction that occurs at inner surfaces of the recesses and mold portions corresponding to the recesses (see fine dotted lines in FIG. 5A). At that time, stress is applied to optical receptacle 120' such that optical receptacle 120' is curved as a whole (see fine solid lines in FIG. 5A). As a result, force is applied to cause third optical surface 122 to be curved as a whole, and thus third optical surface 122 is undesirably distorted (see thick solid lines in FIG. 5A).

On the other hand, as illustrated in FIG. 6A, optical receptacle 120 according to Embodiment 1 has first recesses 124 formed on one side surface and second recesses 125 formed on a side surface opposite to the one side surface, and thus requires a mold that molds both side surfaces opposite to each other in the injection molding. In the case where such a mold is used to perform injection molding followed by releasing, optical receptacle 120 is pulled in directions opposite to each other by friction that occurs at the inner surfaces of first recesses 124 and mold portions corresponding to first recesses 124 and by friction that occurs at the inner surfaces of second recesses 125 and mold portions corresponding to second recesses 125. At that time, stress caused by friction that occurs at the inner surfaces of first recesses 124 and the mold portions corresponding to first recesses 124 is offset by stress caused by friction that occurs at the inner surfaces of second recesses 125 and the mold portions corresponding to second recesses 125. Accordingly, no large force is applied to optical receptacle 120. Therefore, as illustrated in FIG. 6B, in optical receptacle 120, distortion in the height direction of third optical surface 122 was suppressed.

(Effects)

As described above, optical receptacle 120 according to Embodiment 1 includes first recesses 124 and second recesses 125 which are disposed opposite to each other such that the central axes thereof coincide with each other, and thus can suppress the occurrence of deformation (distortion) during releasing even when optical receptacle 120 is produced by injection molding.

Embodiment 2

An optical module according to Embodiment 2 differs from optical module 100 according to Embodiment 1 in the shape of optical receptacle 220. Thus, the components same as those of optical module 100 according to Embodiment 1 are given the same symbols as those of optical module 100 according to Embodiment 1 and the description thereof is omitted, and different components of the optical module are mainly described. Optical receptacle 220 according to Embodiment 2 differs from optical receptacle 120 according to Embodiment 1 in that optical receptacle 220 has a plurality of recesses 221 instead of the plurality of first recesses 124 and the plurality of second recesses 125.

(Configuration of Optical Receptacle]

FIGS. 7A to 7E illustrate a configuration of optical receptacle 220 according to Embodiment 2 of the present invention. FIGS. 7A, 7B, 7C, 7D, and 7E are, respectively, a plan view, a bottom view, a front view, a rear view, and a right side view of optical receptacle 220 according to Embodiment 2.

As illustrated in FIGS. 7A to 7E, optical receptacle 220 according to Embodiment 2 includes a plurality of first optical surfaces 121, third optical surface 122, a plurality of second optical surfaces 123, and a plurality of recesses 221.

Recesses 221 are each a portion for fixing optical transmission members 116 to optical receptacle 220 (surface on which the plurality of second optical surfaces 123 are disposed). The present embodiment is intended to suppress the deformation of the optical receptacle during releasing at the time of injection molding, by devising the shape of recess 221. That is, recess 221 has functions of both first recess 124 and second recess 125 according to Embodiment 1. Recess 221 is formed on a side surface of optical receptacle 220, on which the plurality of second optical surfaces 123 are disposed. Further, the number of recesses 221 is set in a manner corresponding to the number of projections of the optical transmission member attachment. In the present embodiment, two recesses 221 are disposed such that all second optical surfaces 123 are interposed therebetween. Recess 221 includes recess body 222 and tapered part 223.

The shape of recess body 222 is not particularly limited as long as recess body 222 enables optical transmission members 116 to be positioned to a surface on which the plurality of second optical surfaces 123 are disposed. In the present embodiment, the shape of recess body 222 is a cylindrical shape. The length (depth) of recess body 222 in the axial direction is preferably 0.3 mm or more from the viewpoint of positioning the projection of the optical transmission member attachment. When the length of recess body 222 in the axial direction is less than 0.3 mm, there is a risk that optical transmission members 116 cannot be properly fixed to the surface on which the plurality of second optical surfaces 123 are disposed.

Tapered part 223 is a truncated cone-shaped portion for suppressing deformation of optical receptacle 220 by alleviating friction that occurs between recess 221 and a corresponding mold portion during releasing. The bottom surface of recess body 222 and the bottom surface of tapered part 223 have the same shape, and the inner peripheral surface of tapered part 223 (tapered surface) is continuous with the inner peripheral surface of recess body 222. While the angle of the inner peripheral surface of tapered part 223 (tapered surface) relative to the central axis of recess 221 is not particularly limited, the angle thereof is about 3°, for example. It is preferable that the central axis of recess body 222 and the central axis of tapered part 223 coincide with each other.

(Measurement of Distortion of Third Optical Surface)

Figure 8A:
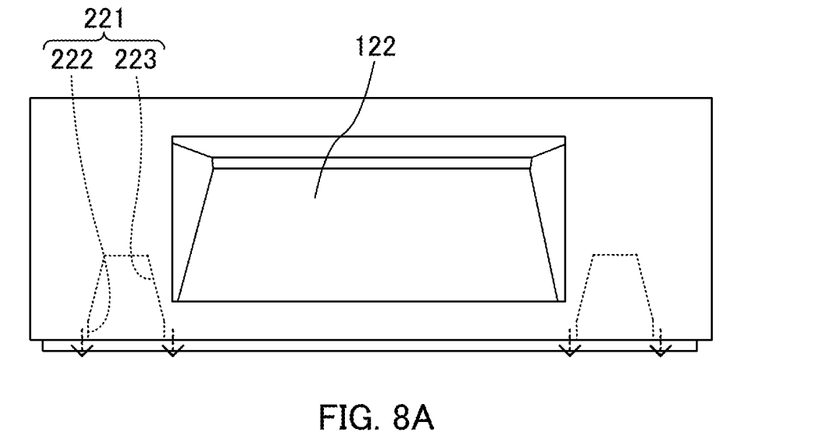
FIGS. 8A and 8B are explanatory diagrams of distortion of the optical receptacle according to Embodiment 2.
Figure 8B:
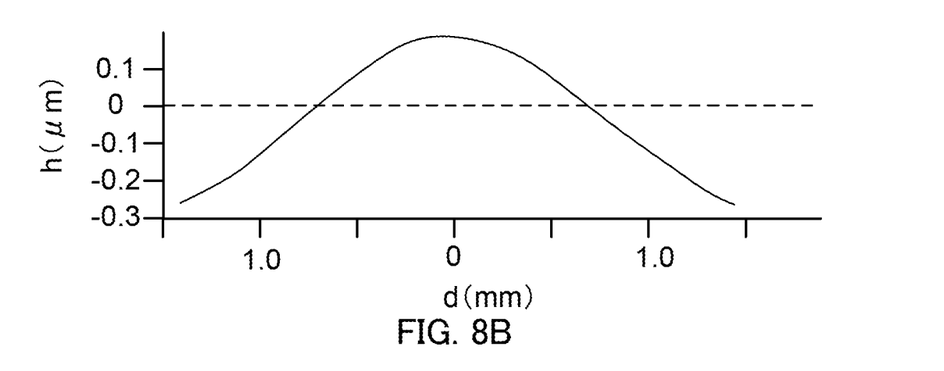

FIGS. 8A and 8B are explanatory diagrams of distortion of third optical surface 122 of optical receptacle 220 produced by injection molding. FIG. 8A illustrates stress applied to optical receptacle 220 of Embodiment 2 during releasing, and FIG. 8B is a graph showing the shape of third optical surface 122 after releasing. In the graph of FIG. 8B, the abscissa indicates distance d from the center of third optical surface 122. The ordinate indicates deformation amount h of third optical surface 122 in the normal direction.

As illustrated in FIG. 8A, optical receptacle 220 according to Embodiment 2 has recesses 221 formed on a side surface, and thus requires a mold that molds a side surface side on which recesses 221 are formed, in the injection molding. In the case where such a mold is used to perform injection molding followed by releasing, optical receptacle 220 is pulled toward the mold side (downward in FIG. 8A) at the positions of recesses 221 by friction that occurs at the inner surfaces of recesses 221 and the mold portions corresponding to recesses 221 (see fine dotted lines in FIG. 8A). At that time, tapered part 223 is formed at the bottom of recess 221, and thus friction is alleviated in optical receptacle 220 compared to optical receptacle 120' of the comparative example illustrated in FIGS. 5A and 5B. Therefore, as illustrated in FIG. 8B, in optical receptacle 220, distortion of third optical surface 122 in the height direction was suppressed.

(Effects)

As described above, optical receptacle 220 according to Embodiment 2 can suppress the occurrence of deformation (distortion) during releasing even when optical receptacle 220 is produced by injection molding, since recesses 221 each include tapered part 223 formed at the bottom thereof.

Note that, while a case where first optical surfaces 121 and second optical surfaces 123 are a convex lens surface is shown in optical receptacles 120 and 220 according to the respective embodiments described above, first optical surfaces 121 and second optical surfaces 123 may be a flat surface. Specifically, only first optical surface 121 may be a flat surface, or only second optical surface 123 may be a flat surface. When first optical surface 121 is formed in a flat surface, third optical surface 122 is formed to function as a concave mirror, for example. When light immediately before reaching second optical surface 123 is effectively converged by first optical surface 121, third optical surface 122, or the like, second optical surface 123 may be formed in a flat surface.

Further, optical receptacles 120 and 220 according to the respective embodiments described above may also be used for a receiving optical module. In this case, the receiving optical module includes a plurality of light receiving elements for receiving light instead of the plurality of light emitting elements 114. The plurality of light receiving elements are disposed on the same positions as the respective corresponding light emitting elements. The receiving optical module has second optical surfaces 123 as incidence surfaces, and first optical surfaces 121 as emission surfaces. Light emitted from the end surface of optical transmission member 116 enters the optical receptacle from second optical surface 123. The light having entered the optical receptacle is reflected by third optical surface 122 to be emitted from first optical surface 121 toward the light receiving element. In the case of an optical module not having a reflection surface, light having entered the optical receptacle is emitted from first optical surface 121 toward the light receiving element.

This application is entitled to and claims the benefit of Japanese Patent Application No. 2013-267214, filed on Dec. 25, 2013, the disclosure of which including the specification, drawings and abstract is incorporated herein by reference in its entirety.

INDUSTRIAL APPLICABILITY

The optical receptacle and optical module according to the present invention are advantageous for optical communications using optical transmission members.

REFERENCE SIGN LIST

10 Optical receptacle
12 Incidence surface
14 Reflection surface
16 Emission surface
18 Guide hole
100 Optical module
110 Photoelectric conversion device
112 Substrate
114 Light emitting element
116 Optical transmission member
120, 120', 220 Optical receptacle
121 First optical surface (Incidence surface)
122 Third optical surface (Reflection surface)
123 Second optical surface (Emission surface)
124 First recess
125 Second recess
221 Recess
222 Recess body
223 Tapered part

The invention claimed is:

1. An optical receptacle disposed between a plurality of light emitting elements or a plurality of light receiving elements and a plurality of optical transmission members and configured to optically couple the light emitting elements or the light receiving elements to end surfaces of the optical transmission members, respectively, the optical receptacle comprising:
    a plurality of first optical surfaces, each configured such that light emitted from a corresponding one of the light emitting elements is incident on the first optical surface, or each configured to emit light propagating therein toward a corresponding one of the light receiving elements;
    a plurality of second optical surfaces, each configured to emit the light incident on the first optical surface toward an end surface of a corresponding one of the optical transmission members, or each configured such that light from a corresponding one of the optical transmission members is incident on the second optical surface;
    a third optical surface configured to reflect the light incident on the first optical surface toward the second optical surface or configured to reflect the light incident on the second optical surface toward the first optical surface;
    a plurality of first recesses formed on a surface on which the plurality of second optical surfaces are disposed or a surface on which the plurality of first optical surfaces are disposed; and
    a plurality of second recesses formed on a surface opposite to a surface on which the first recesses are disposed,
    wherein the plurality of first recesses and the plurality of second recesses are disposed opposite to each other such that central axes of the first recesses coincide, respectively, with central axes of the second recesses.

2. The optical receptacle according to claim 1, wherein the plurality of first recesses are formed at positions symmetrical with respect to a plane as a symmetry plane which is parallel to an optical axis of light passing through the second optical surface and halves the third optical surface in a vertical direction.

3. The optical receptacle according to claim 1, wherein a projection is inserted into at least one of the first recesses, in order to attach the optical transmission members to the surface on which the plurality of second optical surfaces are disposed.

4. An optical module comprising:
    a substrate on which a plurality of light emitting elements or a plurality of light receiving elements are disposed; and
    the optical receptacle according to claim 1 disposed on the substrate.

5. The optical receptacle according to claim 2, wherein a projection is inserted into at least one of the first recesses, in order to attach the optical transmission members to the surface on which the plurality of second optical surfaces are disposed.

6. An optical module comprising:
    a substrate on which a plurality of light emitting elements or a plurality of light receiving elements are disposed; and
    the optical receptacle according to claim 2 disposed on the substrate.

7. An optical module comprising:
    a substrate on which a plurality of light emitting elements or a plurality of light receiving elements are disposed; and
    the optical receptacle according to claim 3 disposed on the substrate.

8. An optical module comprising:
    a substrate on which a plurality of light emitting elements or a plurality of light receiving elements are disposed; and
    the optical receptacle according to claim 5 disposed on the substrate.

* * * * *